US008164360B2

United States Patent

(12) United States Patent
Morii
(10) Patent No.: US 8,164,360 B2
(45) Date of Patent: Apr. 24, 2012

(54) SEMICONDUCTOR OUTPUT CIRCUIT, EXTERNAL OUTPUT SIGNAL GENERATION METHOD, AND SEMICONDUCTOR DEVICE

(75) Inventor: Masaharu Morii, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/042,780

(22) Filed: Mar. 5, 2008

(65) Prior Publication Data

US 2008/0218214 A1 Sep. 11, 2008

(30) Foreign Application Priority Data

Mar. 6, 2007 (JP) ................................ 2007-055046

(51) Int. Cl.
*H03K 19/094* (2006.01)

(52) U.S. Cl. ............................ 326/83; 326/86; 327/109

(58) Field of Classification Search .............. 326/82–83, 326/86; 327/108–109
See application file for complete search history.

(56) References Cited

U.S. PATENT DOCUMENTS 4,800,303 A * 1/1989 Graham et al. ................ 326/72
5,089,723 A * 2/1992 Davis et al. ..................... 326/84
5,121,080 A * 6/1992 Scott et al. .................... 330/260
5,235,218 A * 8/1993 Matsuo et al. ................ 327/538
5,426,383 A * 6/1995 Kumar .......................... 326/119
5,585,763 A * 12/1996 Navabi et al. ................ 330/255
5,646,549 A 7/1997 Yamamoto
5,905,389 A * 5/1999 Alleven ........................ 327/108
5,912,569 A * 6/1999 Alleven ........................ 327/108
6,054,874 A * 4/2000 Sculley et al. .................. 326/83
6,160,441 A * 12/2000 Stratakos et al. ............ 327/540
6,194,887 B1 * 2/2001 Tsukada ....................... 323/315
6,229,396 B1 5/2001 Zabroda
6,275,066 B1 * 8/2001 Park et al. ....................... 326/86
6,331,785 B1 * 12/2001 Swanson et al. ................ 326/30
6,445,244 B1 * 9/2002 Stratakos et al. ............ 327/540
6,836,150 B2 * 12/2004 Regev ............................. 326/83
7,084,669 B2 * 8/2006 Regev ............................. 326/83
7,170,318 B2 * 1/2007 Kim et al. ....................... 326/83
7,345,504 B2 * 3/2008 Lin et al. ......................... 326/30
2003/0227797 A1 12/2003 Jung

FOREIGN PATENT DOCUMENTS

JP 06-152261 A 5/1994
JP 09-008637 A 1/1997
JP 09-046141 A 2/1997
JP 2001-257728 A 9/2001
JP 2002-232243 A 8/2002
JP 2004-015804 A 1/2004

* cited by examiner

*Primary Examiner* — Jason M Crawford
(74) *Attorney, Agent, or Firm* — Arent Fox LLP

(57) ABSTRACT

A semiconductor output circuit, an external output signal generation method and a semiconductor device that suppress variation in an external output signal caused by a decrease in power supply voltage. An output section changes electric potential of an external output signal EB according to a change in electric potential of an internal input signal A from ground to VDD or from VDD to the ground. A differential section outputs an output signal corresponding to the external output signal EB and a predetermined reference signal VREF. The differential section functions as a voltage follower so that the electric potential of the external output signal EB will correspond to the predetermined reference signal VREF. As a result, variation in output voltage VOL at a low voltage side of the external output signal EB is suppressed.

3 Claims, 9 Drawing Sheets

SEMICONDUCTOR OUTPUT CIRCUIT, EXTERNAL OUTPUT SIGNAL GENERATION METHOD, AND SEMICONDUCTOR DEVICE

CROSS-REFERENCE TO RELATED APPLICATIONS

This application is based upon and claims the benefits of priority from the prior Japanese Patent Application No. 2007-055046 filed on Mar. 6, 2007, the entire contents of which are incorporated herein by reference.

BACKGROUND (1) Field

This embodiment relates to a semiconductor output circuit, an external output signal generation method, and a semiconductor device and, more particularly, to a semiconductor output circuit and an external output signal generation method for generating an external output signal used for transmitting information between chips and a semiconductor device including such a semiconductor output circuit.

(2) Description of the Related Art

The microfabrication technology of large-scale integration (LSI) has raised the integration levels of chips and the number of functional circuits which can be formed on one chip has increased rapidly. However, many of ordinary semiconductor integrated circuit devices do not have a structure in which many functions are performed by one chip, but a structure in which a plurality of chips each having a predetermined function are coupled by bus wirings. Accordingly, each chip includes a (semiconductor) output circuit for outputting a signal used for transmitting information between chips.

FIG. 7 is a circuit diagram showing an example of the structure of a conventional semiconductor output circuit.

FIG. 7 shows an output circuit portion for outputting an external output signal EB from a chip 91 including the semiconductor output circuit to a second chip 93. In this example, a gunning transceiver logic (GTL) output circuit which is one of input-output interfaces is shown.

An internal input signal A electric potential of which changes according to the operation of a functional circuit (not shown) included in the chip 91 is coupled to a gate of a transistor 91*b* included in an n-channel open drain circuit at an output stage via an inverter 91*c*. VDD is internal power supply voltage. When the electric potential of the internal input signal A changes from ground to positive power supply voltage (logical value of the internal input signal A changes from L to H), the transistor 91*b* at the output stage goes into a non-conductive state (off state). As a result, electric potential of an external output signal EB outputted via a pad 91*a* is raised to terminal voltage VT. When the electric potential of the internal input signal A changes in the reverse direction (logical value of the internal input signal A changes from H to L), the transistor 91*b* at the output stage goes into a conductive state (on state). As a result, the electric potential of the external output signal EB decreases to output voltage VOL at a low voltage side. At a receiving end, a change of the external output signal EB caused by the turning on and off of the transistor 91*b* is detected as a slight change in amplitude with respect to reference voltage and the logical value of the external output signal EB is determined. For example, it is fixed that terminal voltage for standard GTL output circuits is 1.2V±5% and that terminal voltage for GTL+ output circuits is 1.5V±10%.

However, as the internal power supply voltage of LSI decreases with an increase in integration level, voltage (Vgs) between the gate and a source of the transistor 91*b* at the output stage becomes smaller and variation in the DC characteristic becomes larger.

Accordingly, a bias circuit for preventing a drop in saturation output power by controlling Vgs in the case of making a GaAs FET for power amplification operate near a saturation region is proposed (see, for example, Japanese Patent Laid-Open Publication No. Hei9-46141 (FIG. 1)).

In addition, a semiconductor output circuit in which Vgs is controlled by dividing output from a voltage follower and by performing negative feedback is proposed (see, for example, Japanese Patent Laid-Open Publication No. 2002-232243 (FIG. 1)).

By the way, a non-saturation conditional expression of an output buffer is given by $$|Vgs-Vth|>|Vds| \tag{1}$$

If the left side "|Vgs−Vth|" becomes smaller, then an operating point shifts from a non-saturation region to a saturation region. When VDD decreases with an increase in integration level, this is a cause of great variation in the DC characteristic of the transistor 91*b* at the output stage. Accordingly, variation in the output voltage VOL at the low voltage side of the external output signal EB the level of which depends on the operation of the transistor 91*b* at the output stage becomes larger.

FIG. 8 is a view showing the output DC characteristics of the output transistor included in the conventional semiconductor output circuit. These DC characteristics are obtained when the voltage of the internal input signal A is low.

When the internal power supply voltage VDD is high, Vgs is large. When the internal power supply voltage VDD becomes lower, Vgs becomes smaller. In FIG. 8, characteristics 95 of the output transistor obtained at the time of Vgs being large before a drop in the internal power supply voltage VDD caused by an increase in integration level and characteristics 96 of the output transistor obtained at the time of Vgs becoming small after the drop in the internal power supply voltage VDD caused by an increase in integration level are shown. A characteristic variation for each Vgs value results from process variation.

Therefore, compared with a variation in VOL (ΔVOL 97) obtained from a load line at the time of Vgs being large, a variation in VOL (ΔVOL 98) obtained at the time of Vgs being small is large. When Vgs is small, the operating point is near the saturation region.

FIG. 9 is a view showing signal waveforms of the conventional semiconductor output circuit. FIG. 9 shows examples of the waveforms of the internal input signal A and the external output signal EB obtained in the case of (A) Vgs=2.5V and (B) Vgs=1.8V.

If (A) Vgs=2.5V, that is to say, if the internal power supply voltage is high and Vgs is large, then a variation in VOL (ΔVOL) of the external output signal EB is 130 mV. If (B) Vgs=1.8V, that is to say, if the internal power supply voltage is low and Vgs drops by 0.7 V, then a variation in VOL (ΔVOL) of the external output signal EB increases to 203 mV.

As has been described, a variation in the DC characteristic of the output transistor and a variation in the output voltage VOL at the low voltage side of the external output signal EB become larger with a decrease in the internal power supply voltage caused by an increase in integration level.

SUMMARY

It is an aspect of the embodiments discussed herein to provide a semiconductor output circuit for generating an external output signal used for transmitting information between chips, the circuit including an output section coupled to an internal input signal for generating the external output signal in response to the internal input signal, and a differential section for outputting an output signal used for controlling the external output signal or an internal signal of the output section according to a predetermined reference signal, one input terminal of the differential section being coupled to the external output signal outputted from the output section or the internal signal, an other input terminal of the differential section being coupled to the predetermined reference signal, an output terminal of the differential section being coupled to the output section.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
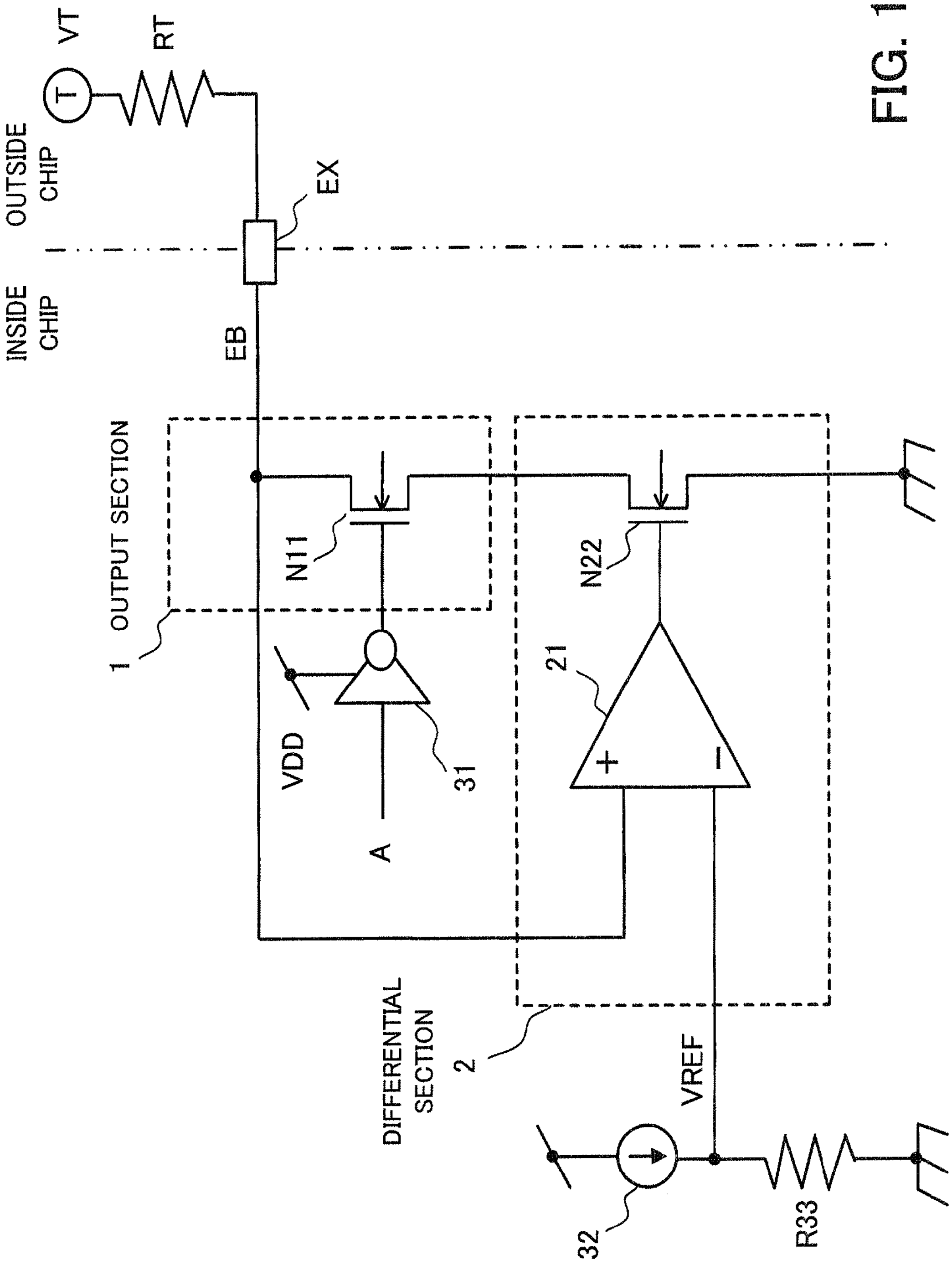
FIG. 1 is a circuit diagram showing the structure of a semiconductor output circuit according to a first embodiment of the present invention.

FIG. 1 is a circuit diagram showing the structure of a semiconductor output circuit according to a first embodiment of the present invention.

The semiconductor output circuit according to the first embodiment of the present invention comprises an output section 1 for generating an external output signal EB and a differential section 2 for controlling voltage of the external output signal EB. In this example, the external output signal EB is directly controlled by an internal input signal A and is connected to one input terminal of the differential section 2.

The output section 1 is an n-channel open drain output circuit an output line of which is connected to an output pad EX for outputting the external output signal EB, A transistor N11 is a unipolar transistor. The internal input signal A is connected to a gate of the transistor N11 via an inverter 31, a transistor N22 for supplying output from the differential section 2 is connected to a source of the transistor N11, and the output pad EX to which the external output signal EB is outputted is connected to a drain of the transistor N11. When electric potential of the internal input signal A changes from ground to power supply voltage VDD, the transistor N11 turns off and electric potential of the external output signal EB rises to VT. When the electric potential of the internal input signal A changes from the power supply voltage VDD to the ground, the transistor N11 at an output stage turns on and the electric potential of the external output signal EB drops to output voltage VOL at a low voltage side.

The differential section 2 includes an operational amplifier (op-amp) 21 and a transistor N22. A reference voltage generation circuit which includes a current source 32 and a resistor 33 and which generates a reference signal VREF is connected to the differential section 2. The external output signal EB is connected to a non-inverting input terminal (+) of the op-amp 21, the reference signal VREF is connected to an inverting input terminal (−) of the op-amp 21, and a gate of the transistor N22 is connected to an output terminal of the op-amp 21. The differential section 2 generates an output signal so that the electric potential of the external output signal EB will be equal to that of the reference signal VREF. A gate of the n-channel transistor 22 is connected to the output terminal of the op-amp 21, a source of the n-channel transistor 22 is connected to the ground, and a drain of the n-channel transistor 22 is connected to the source of the transistor N11 of the output section 1 in series. The n-channel transistor 22 controls the voltage of the source of the transistor N11 of the output section 1 according to the output signal from the op-amp 21.

In the reference voltage generation circuit, the current source 32 and the resistor 33 are connected in series. The reference voltage generation circuit generates a constant voltage (reference voltage VREF) which depends on the current source 32 and the resistor 33.

The operation of the semiconductor output circuit according to the first embodiment of the present invention having the above structure will be described.

When the electric potential of the internal input signal A changes from the ground to VDD (logical value of the internal input signal A changes from L to H), the transistor N11 at the output stage turns off and the electric potential of the external output signal EB rises to VT. At this time the transistor N11 is in the off state, so the op-amp 21 of the differential section 2 exerts no influence on the external output signal EB. When the electric potential of the internal input signal A changes from VDD to the ground (logical value of the internal input signal A changes from H to L), the transistor N11 turns on and the electric potential of the external output signal EB drops to VOL. At this time the transistor N11 is in the on state, so the external output signal EB is influenced by the differential section 2 connected in series with the transistor N11. Negative feedback by the op-amp 21 functions in the differential section 2 so as to make the electric potential of the external output signal EB the reference voltage VREF. Therefore, when the internal input signal A is at the L level, the differential section 2 functions so as to make the electric potential of the external output signal EB the reference voltage VREF. If the reference voltage VREF is set to the output voltage VOL at the low voltage sides control is exercised regardless of the value of the internal power supply voltage VDD so that the electric potential of the external output signal EB will become the output voltage VOL at the low voltage side. As a result, variation in the output voltage VOL at the low voltage side of the external output signal EB can be decreased.

As stated above, with the semiconductor output circuit according to the first embodiment of the present invention the negative feedback by the differential section 2 functions so that the output voltage VOL at the low voltage side of the external output signal EB will become a predetermined voltage. As a result, variation in the output voltage VOL at the low voltage side can be decreased. This function is carried out regardless of the value of the internal power supply voltage VDD. However, this function has a great effect especially on variation in the output voltage VOL at the low voltage side which becomes larger with a drop in the internal power supply voltage VDD.

Figure 2:
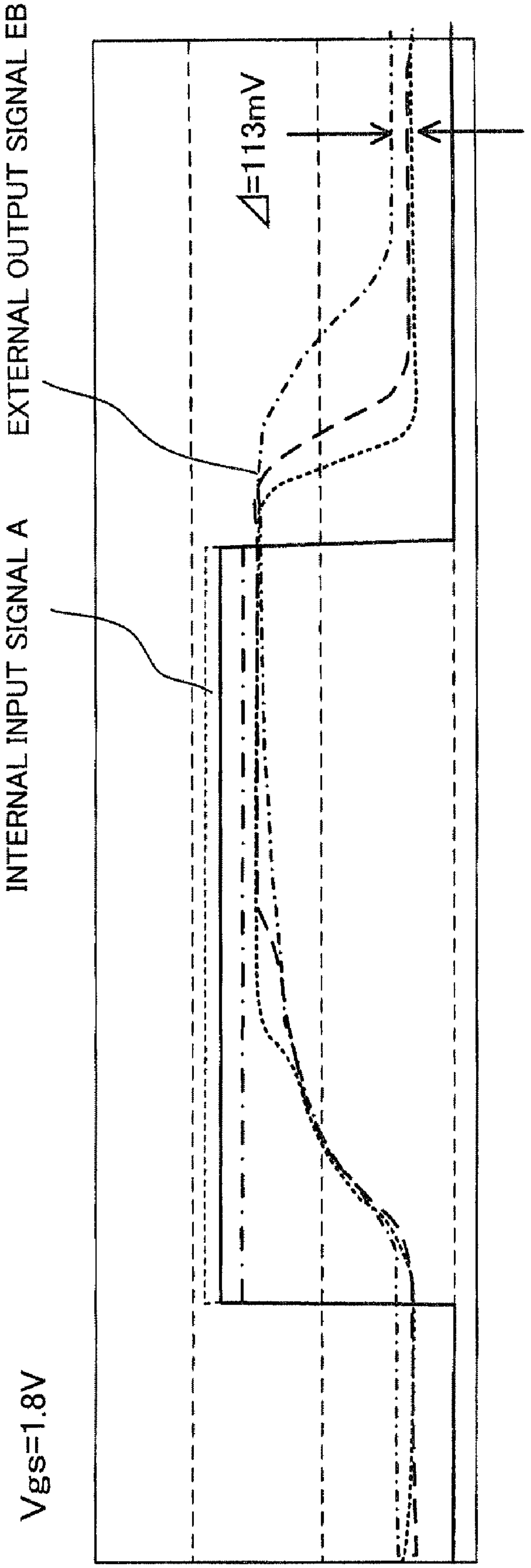
FIG. 2 is a view showing signal waveforms of the semiconductor output circuit according to the first embodiment of the present invention.

FIG. 2 is a view showing signal waveforms of the semiconductor output circuit according to the first embodiment of the present invention.

FIG. 2 shows examples of waveforms of the internal input signal A and the external output signal EB obtained at the time of Vgs=1.8 V (this is the same with the case of FIG. 9 in which Vgs in the conventional semiconductor output circuit is small).

With the semiconductor output circuit according to the first embodiment of the present invention a variation in the output voltage VOL (ΔVOL) at the low voltage side of the external output signal EB decreases to 113 mV even if the internal power supply voltage VDD is low (Vgs=1.8 V).

Figure 9A:
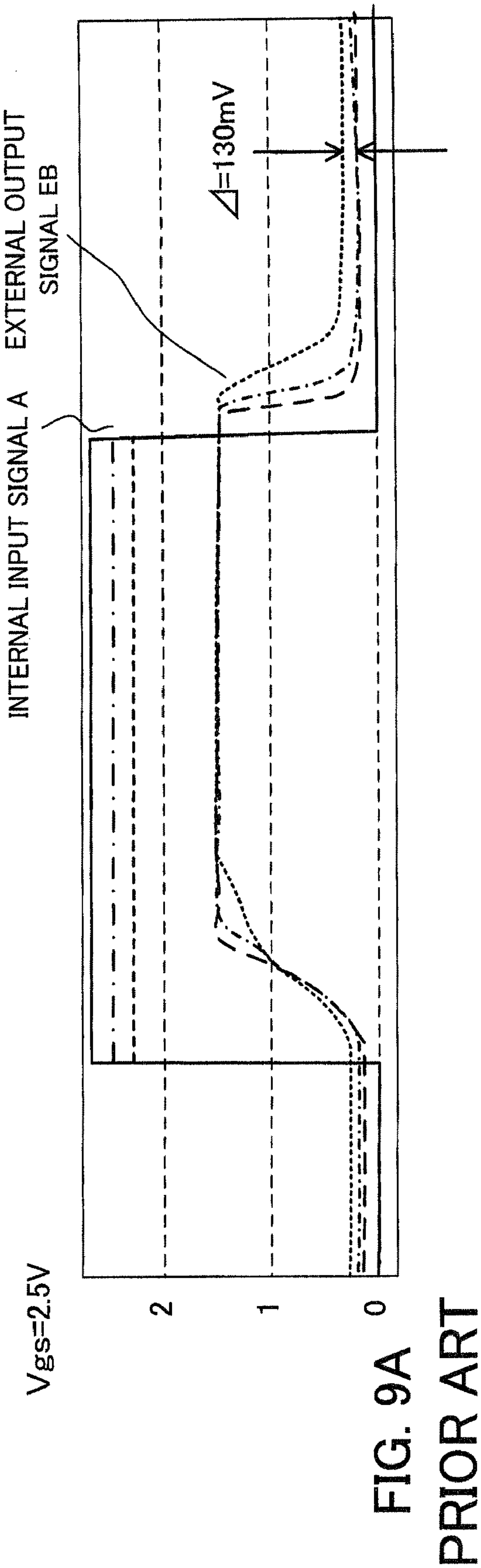
FIG. 9 is a view showing signal waveforms of the conventional semiconductor output circuit.
Figure 9B:
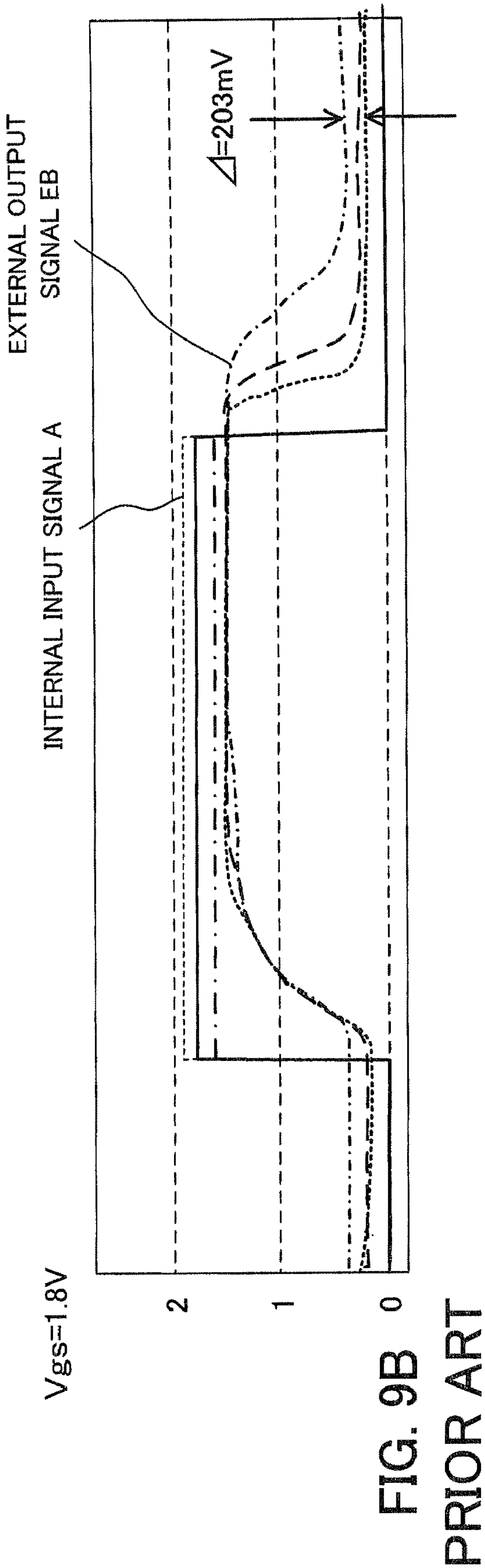

The variation in VOL (ΔVOL) in the conventional semiconductor output circuit which is shown in FIG. 9B and which occurs under the same condition is 203 mV. The variation in VOL (ΔVOL) in the semiconductor output circuit according to the first embodiment of the present invention is significantly small compared with this value. This means that the semiconductor output circuit according to the first embodiment of the present invention is highly effective in suppressing variation in VOL. As can be seen from FIG. 2, the variation in the output voltage VOL at the low voltage side of the external output signal EB in the semiconductor output circuit according to the first embodiment of the present invention is smaller than the variation of 130 mV in VOL which is shown in FIG. 9A and which occurs in the conventional semiconductor output circuit.

As stated above, the semiconductor output circuit according to the first embodiment of the present invention is highly effective in suppressing variation in the output voltage VOL at the low voltage side.

A second embodiment of the present invention will now be described.

Figure 3:
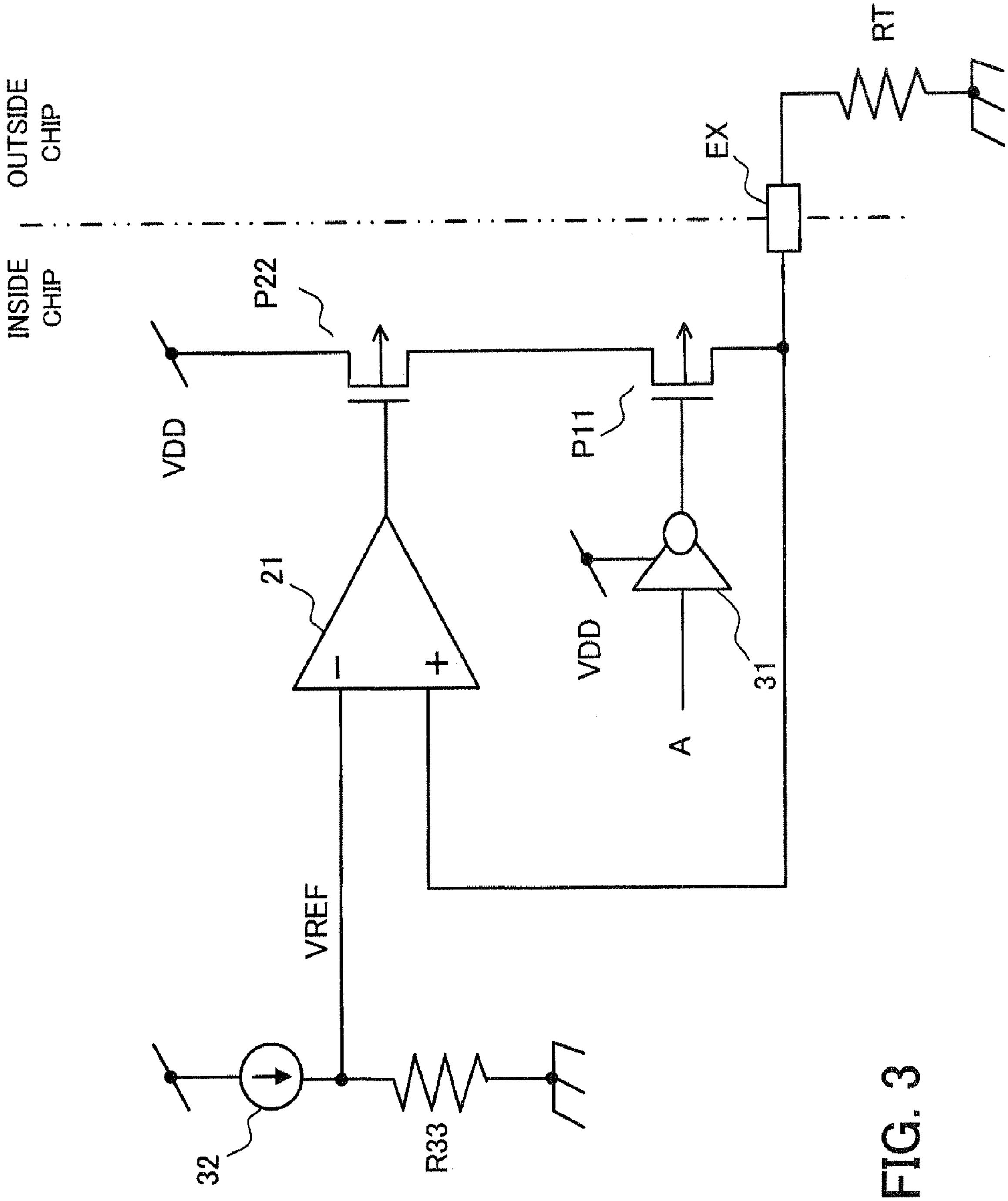
FIG. 3 is a circuit diagram showing the structure of a semiconductor output circuit according to a second embodiment of the present invention.

FIG. 3 is a circuit diagram showing the structure of a semiconductor output circuit according to a second embodiment of the present invention.

The semiconductor output circuit according to the first embodiment of the present invention shown in FIG. 1 includes the n-channel open drain output circuit. With a semiconductor output circuit according to the second embodiment of the present invention the n-channel open drain output circuit is replaced with a p-channel open drain output circuit.

That is to say, with the semiconductor output circuit according to the second embodiment of the present invention, the n-channel transistor N11 of the output section 1 included in the semiconductor output circuit according to the first embodiment of the present invention shown in FIG. 1 is replaced with a p-channel transistor P11 and the n-channel transistor N22 of the differential section 2 included in the semiconductor output circuit according to the first embodiment of the present invention shown in FIG. 1 is replaced with a p-channel transistor P22.

The semiconductor output circuit according to the second embodiment of the present invention operates the same as the semiconductor output circuit according to the first embodiment of the present invention. That is to say, when electric potential of an internal input signal A changes from ground to VDD, the transistor P11 turns on. At this time an op-amp 21 functions so that electric potential of an external output signal EB will become reference voltage VREF. As a result, variation in output voltage VOL at a low voltage side of the external output signal EB can be decreased.

Accordingly, variation in the output voltage VOL at the low voltage side of the external output signal EB can be suppressed by adopting the semiconductor output circuit according to the second embodiment of the present invention.

A third embodiment of the present invention will now be described.

Figure 4:
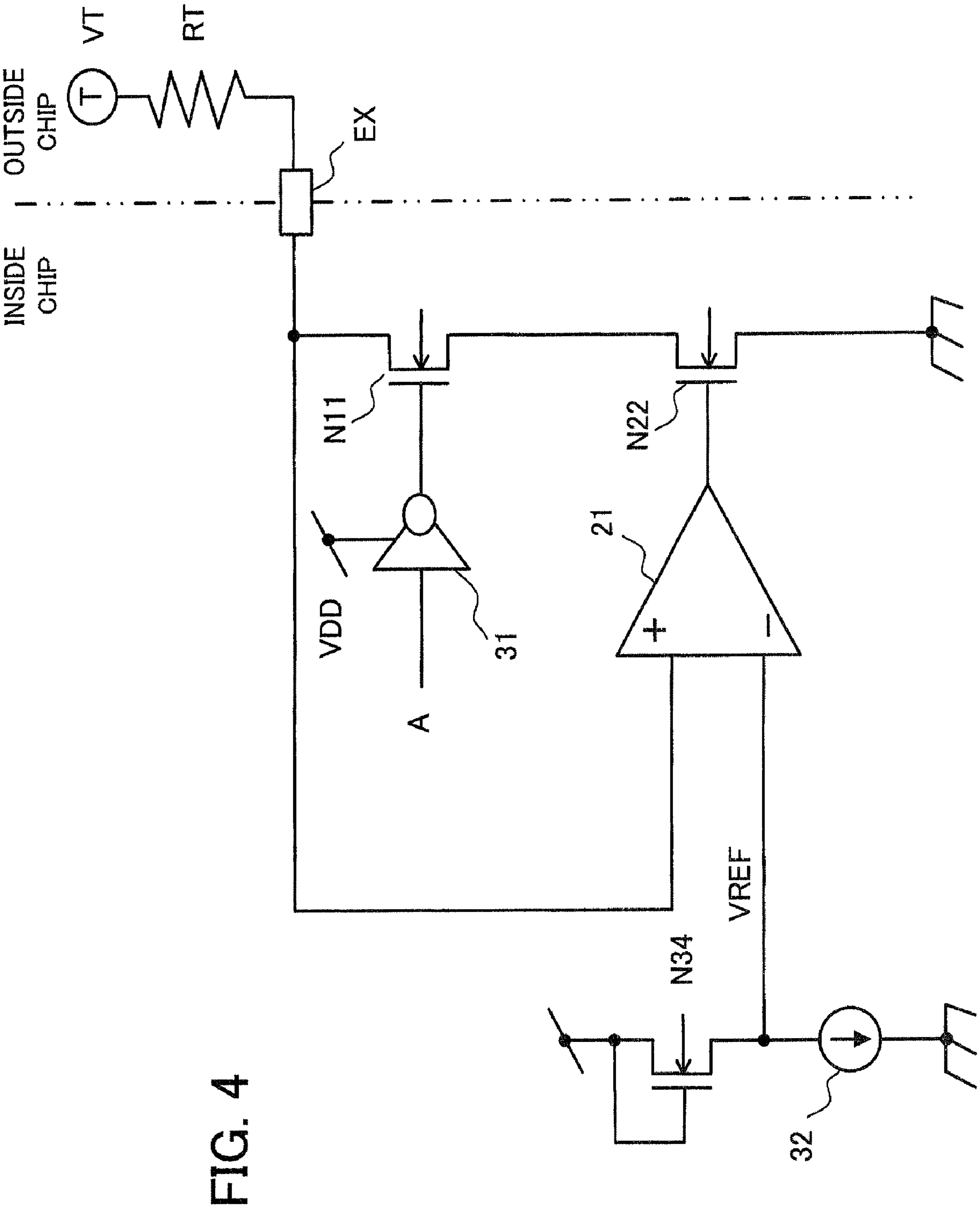
FIG. 4 is a circuit diagram showing the structure of a semiconductor output circuit according to a third embodiment of the present invention.

FIG. 4 is a circuit diagram showing the structure of a semiconductor output circuit according to a third embodiment of the present invention.

With a semiconductor output circuit according to the third embodiment of the present invention, the current source 32 and the resistor 33 included in the reference voltage generation circuit which generates the reference voltage VREF connected to the inverting input terminal (−) of the op-amp 21 of the differential section 2 included in the semiconductor output circuit according to the first embodiment of the present invention shown in FIG. 1 are replaced with a transistor N34 and a current source 32.

A reference voltage generation circuit included in the semiconductor output circuit according to the third embodiment of the present invention includes the current source 32 and the transistor N34 a source of which is connected to the current source 32 and a drain and a gate of which are connected to internal power supply VDD. The source of the transistor N34 is connected to an inverting input terminal (−) of an op-amp 21. A channel type of the transistor N34 is the same as a channel type of a transistor N11 of an output section. The value of the reference voltage VREF generated by the reference voltage generation circuit included in the semiconductor output circuit according to the first embodiment of the present invention is constant and depends on an electric current and resistance. However, reference voltage VREF generated by the reference voltage generation circuit included in the semiconductor output circuit according to the third embodiment of the present invention depends on transistor characteristics that are the same as those of the transistor N11 of the output section.

The value of the reference voltage VREF generated by the reference voltage generation circuit included in the semiconductor output circuit according to the first embodiment of the present invention is always constant. However, the electric potential of the external output signal EB outputted deviates slightly from the reference voltage VREF because of characteristics of, for example, the transistor N11 at the output stage, depending on the value of the reference voltage VREF. Accordingly, the transistor N34 having the same characteristics is located in the reference voltage generation circuit of the semiconductor output circuit according to the third embodiment of the present invention in order to control the value of the reference voltage VREF.

The semiconductor output circuit according to the third embodiment of the present invention having the above structure has the following characteristic. The reference voltage VREF functions so as to cancel, for example, an offset in a differential section caused by variation in a process for fabricating the output section.

A fourth embodiment of the present invention will now be described.

Figure 5:
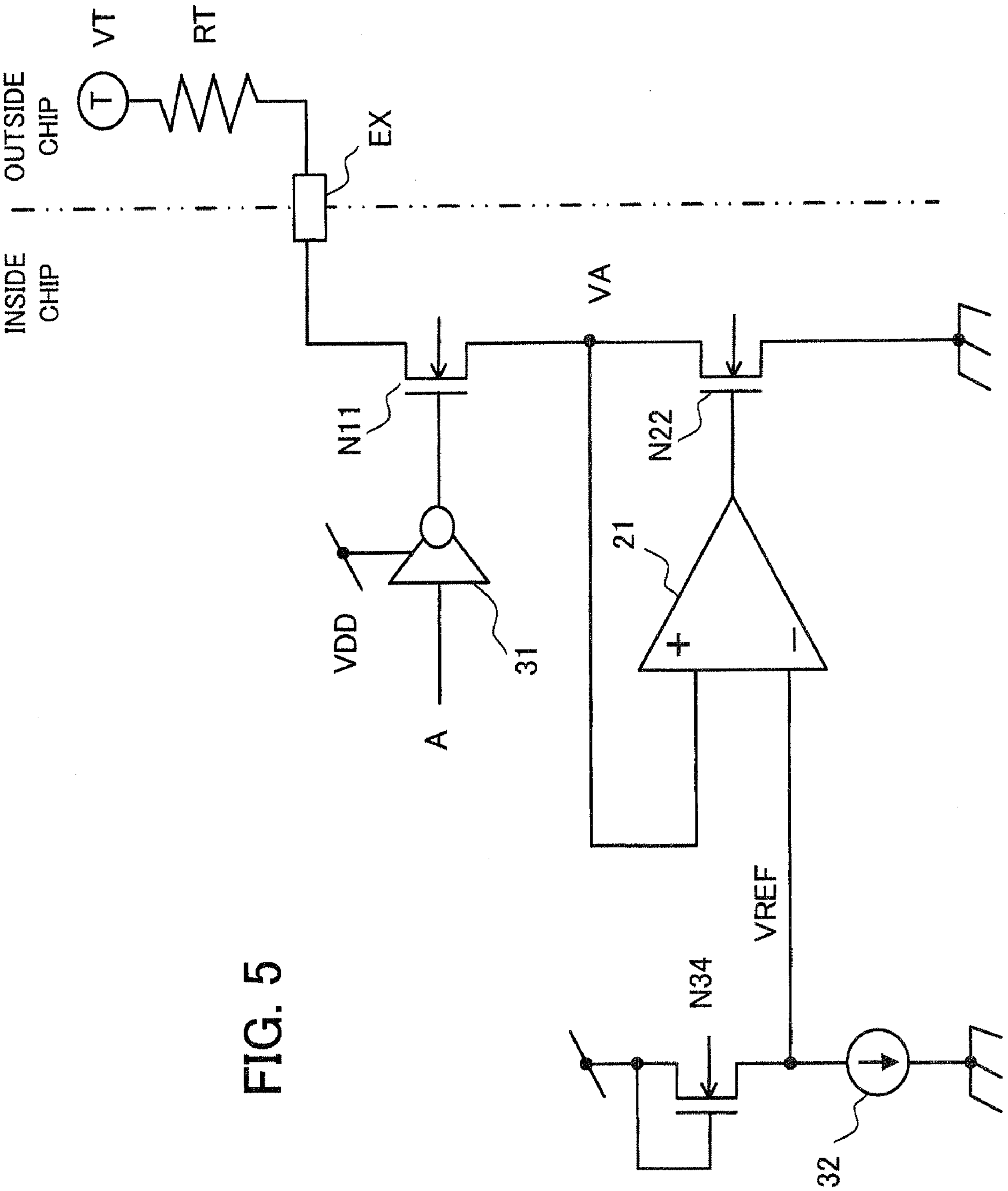
FIG. 5 is a circuit diagram showing the structure of a semiconductor output circuit according to a fourth embodiment of the present invention.

FIG. 5 is a circuit diagram showing the structure of a semiconductor output circuit according to a fourth embodiment of the present invention.

With the semiconductor output circuit according to the third embodiment of the present invention shown in FIG. 4, the op-amp 21 feeds back an external output signal EB. With the semiconductor output circuit according to the fourth embodiment of the present invention, however, a non-inverting input terminal (+) of an op-amp 21 is connected to a midpoint between a transistor N11 of an output section and a transistor N22 of a differential section connected in series with the transistor N11 and an internal signal of the output section is fed back.

With the semiconductor output circuit according to the fourth embodiment of the present invention the op-amp 21 performs negative feedback of voltage VA of the internal signal of the transistor N11 of the output section. By doing so, the op-amp 21 exercises control so that VA will become reference voltage VREF. With the semiconductor output circuits according to the first through third embodiments of the present invention the external output signal EB is fed back so that the output voltage VOL at the low voltage side will become the reference voltage VREF. However, the level of the external output signal EB varies according to variation in the internal input signal A. As a result, it is difficult to make the op-amp 21 operate stably in a transition period in which the external output signal EB varies. Accordingly, with the semiconductor output circuit according to the fourth embodiment of the present invention a source of the transistor N11 is connected, not to an external output signal EB which varies according to variation in an internal input signal A, but to the non-inverting input terminal (+) of the op-amp 21. That is to say, the internal signal of the output section is fed back. By doing so, the differential section functions so as to make VA the reference voltage VREF.

The semiconductor output circuit according to the fourth embodiment of the present invention having the above structure has the following characteristic. The circuit which varies according to variation in the internal input signal A is connected not as part of negative feedback but as a load. Accordingly, it is easy to stabilize the circuit.

A fifth embodiment of the present invention will now be described.

Figure 6:
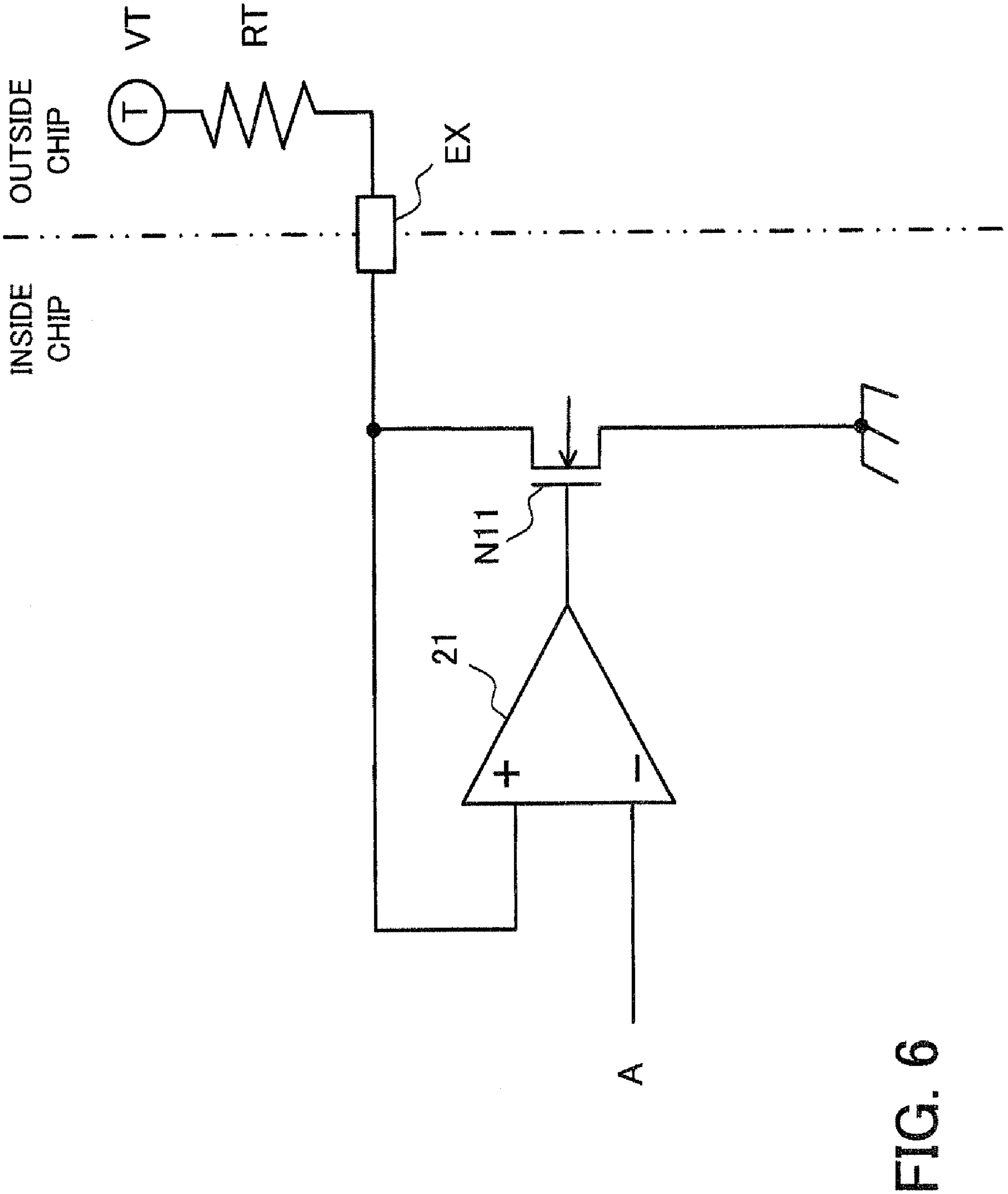
FIG. 6 is a circuit diagram showing the structure of a semiconductor output circuit according to a fifth embodiment of the present invention.
Figure 7:
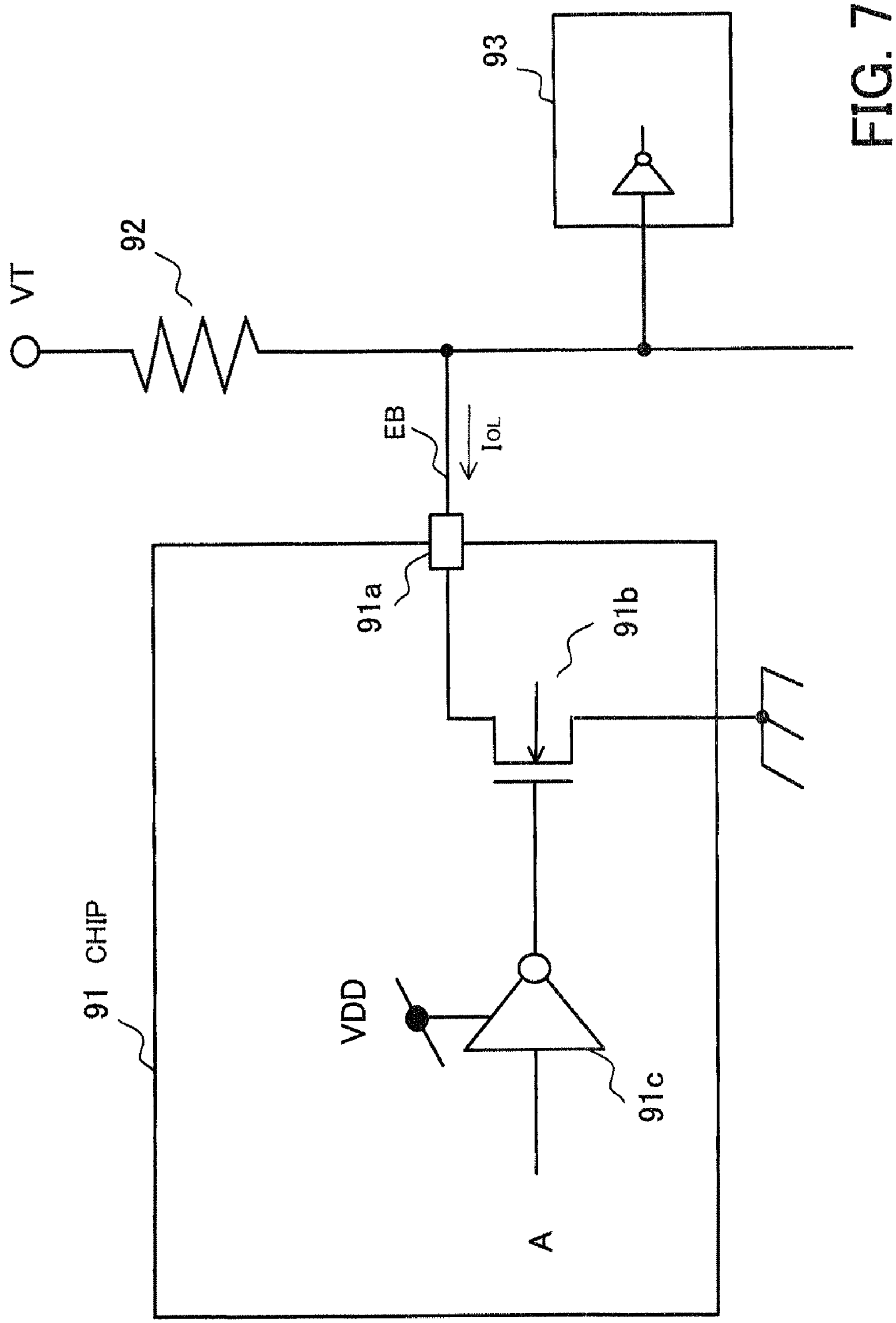
FIG. 7 is a circuit diagram showing an example of the structure of a conventional semiconductor output circuit.
Figure 8:
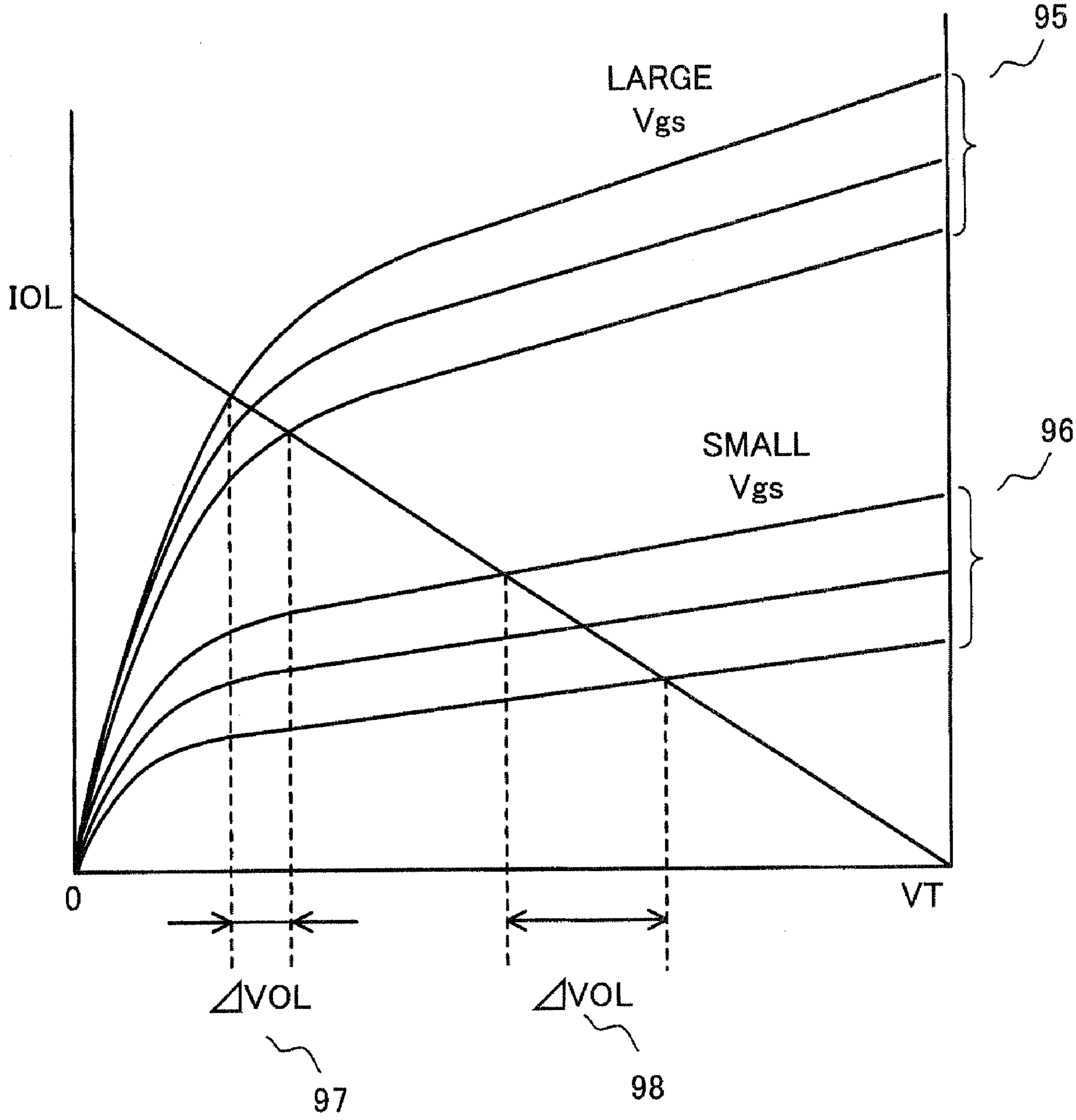
FIG. 8 is a view showing the output DC characteristics of an output transistor included in the conventional semiconductor output circuit.

FIG. 6 is a circuit diagram showing the structure of a semiconductor output circuit according to a fifth embodiment of the present invention.

With the semiconductor output circuits according to the first through fourth embodiments of the present invention the transistor N11 or P11 at the output stage is directly controlled by the internal input signal A. With the semiconductor output circuit according to the fifth embodiment of the present invention, however, an internal input signal A controls a transistor N11 via a differential section.

With the semiconductor output circuit according to the fifth embodiment of the present invention, the reference voltage generation circuit which is included in the semiconductor output circuit according to the first embodiment of the present invention and which supplies a predetermined reference voltage to the op-amp 21 is replaced with the internal input signal A and output from an op-amp 21 is directly connected to the transistor N11 of an output section. Accordingly, the op-amp 21 exercises control so that output voltage VOL at a low voltage side of an external output signal EB will be equal to voltage at a low voltage side of the internal input signal A.

With the semiconductor output circuit according to the fifth embodiment of the present invention having the above structure, control is exercised so that the output voltage VOL at the low voltage side of the external output signal EB will become constant. Accordingly, variation in the output voltage VOL at the low voltage side can be suppressed.

The above first through fifth embodiments of the present invention are examples of circuit structure. It is a matter of course that other circuits can be formed by combining each section included in the semiconductor output circuits according to the first through fifth embodiments of the present invention shown. In addition, details such as the reference voltage generation circuit can properly be replaced with other circuits.

As has been described in the foregoing, with the semiconductor output circuits according to the embodiments of the present invention the problematic variation in the output voltage VOL at the low voltage side of the external output signal EB caused by an increase in integration level can be suppressed.

Each of the semiconductor output circuits according to the above embodiments of the present invention is applied to a semiconductor device in which a plurality of chips each having a predetermined function are connected by bus wirings. With a semiconductor device according to an embodiment of the present invention one of the above output circuits is used as an output section which outputs an information transmission signal used for transmitting information between chips. An external output signal (information transmission signal) outputted from the output circuit is sent to a second chip via a bus and is inputted to the chip at the receiving end. The information transmitted is extracted in the chip at the receiving end on the basis of whether the level of the information transmission signal inputted is at the terminal voltage VT or at the output voltage VOL at the low voltage side. Therefore, variation in the output voltage VOL at the low voltage side of the external output signal is suppressed by one of the output circuits having the above structure. As a result, a level can easily be detected in the chip at the receiving end and the information is transmitted stably.

With the semiconductor output circuits according to the present invention the differential section controls the level of the external output signal outputted from the output section. Accordingly, variation in the output voltage at the low voltage side of the external output signal which may occur due to a decrease in the internal power supply voltage caused by, for example, an increase in integration level can be suppressed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device which is included in a first chip and is coupled via a bus wiring to a second chip, which is different from the first chip, the semiconductor device comprising:

an external output terminal coupled to the bus wiring;

a first transistor having a gate for receiving an internal input signal, a drain coupled to the external output terminal for outputting to the external output terminal an external output signal generated in response to the internal input signal, and a source;

an operation amplifier having one input terminal coupled to the drain of the first transistor, another input terminal for receiving a predetermined reference signal, and an output terminal;

a second transistor having a gate coupled to the output terminal of the operation amplifier, and a drain coupled to the source of the first transistor; and an inverter that operates with power supply voltage supplied to the first chip, and receives the internal input signal and inverts and outputs the internal input signal to the gate of the first transistor, wherein the external output signal is outputted via the external output terminal to the second chip which is different from the first chip; and wherein the internal input signal is a switching signal.

2. The semiconductor device according to claim 1, wherein the first transistor is a unipolar transistor, and therein the semiconductor device further comprising a reference voltage generation section coupled to the another input terminal of the operational amplifier for generating the predetermined reference signal, wherein the reference voltage generation section includes a transistor a channel type of which is the same as a channel type of the first transistor.

3. The semiconductor device according to claim 1, wherein the external output signal is transmitted as information to the second chip via the bus wiring.

* * * * *